(12) United States Patent
Bauman

(10) Patent No.: US 11,029,852 B2
(45) Date of Patent: *Jun. 8, 2021

(54) DEDICATED INTERFACE FOR COUPLING FLASH MEMORY AND DYNAMIC RANDOM ACCESS MEMORY

(71) Applicant: Advanced Micro Devices, Inc., Sunnyvale, CA (US)

(72) Inventor: James Bauman, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 421 days.

This patent is subject to a terminal disclaimer.

(21) Appl. No.: 15/378,473

(22) Filed: Dec. 14, 2016

(65) Prior Publication Data

US 2017/0153815 A1 Jun. 1, 2017

Related U.S. Application Data

(63) Continuation of application No. 14/586,350, filed on Dec. 30, 2014, now Pat. No. 9,547,447.

(60) Provisional application No. 61/923,608, filed on Jan. 3, 2014.

(51) Int. Cl.
| | |
|---|---|
| *G11C 29/00* | (2006.01) |
| *G06F 3/06* | (2006.01) |
| *G06F 11/10* | (2006.01) |
| *G06F 12/0862* | (2016.01) |
| *G06F 13/16* | (2006.01) |
| *G06F 13/40* | (2006.01) |
| *G11C 14/00* | (2006.01) |
| *G11C 29/52* | (2006.01) |

(52) U.S. Cl.
CPC ............ *G06F 3/061* (2013.01); *G06F 3/0614* (2013.01); *G06F 3/0646* (2013.01); *G06F 3/0647* (2013.01); *G06F 3/0659* (2013.01); *G06F 3/0685* (2013.01); *G06F 11/1008* (2013.01); *G06F 11/1016* (2013.01); *G06F 11/1072* (2013.01); *G06F 12/0862* (2013.01); *G06F 13/16* (2013.01); *G06F 13/4068* (2013.01); *G11C 14/0018* (2013.01); *G06F 11/1068* (2013.01); *G06F 2212/6028* (2013.01); *G06F 2212/7201* (2013.01); *G11C 29/52* (2013.01)

(58) Field of Classification Search
CPC ............... G06F 3/0685; G06F 11/1072; G06F 11/1016; G06F 11/1008
See application file for complete search history.

(56) References Cited

U.S. PATENT DOCUMENTS

| | | | |
|---|---|---|---|
| 2009/0046533 A1* | 2/2009 | Jo ...................... | G06F 13/1694 365/230.03 |
| 2010/0088460 A1* | 4/2010 | Jeddeloh ............. | G06F 12/0866 711/103 |
| 2013/0086309 A1* | 4/2013 | Lee ..................... | G06F 12/0246 711/103 |

\* cited by examiner

*Primary Examiner* — Samir W Rizk

(57) ABSTRACT

The present application describes embodiments of an interface for coupling flash memory and dynamic random access memory (DRAM) in a processing system. Some embodiments include a dedicated interface between a flash memory and DRAM. The dedicated interface is to provide access to the flash memory in response to instructions received over a DRAM interface between the DRAM and a processing device. Some embodiments of a method include accessing a flash memory via a dedicated interface between the flash memory and a dynamic random access memory (DRAM) in response to an instruction received over a DRAM interface between the DRAM and a processing device.

20 Claims, 7 Drawing Sheets

DEDICATED INTERFACE FOR COUPLING FLASH MEMORY AND DYNAMIC RANDOM ACCESS MEMORY

CROSS-REFERENCE TO RELATED APPLICATIONS

The present application claims priority to U.S. patent application Ser. No. 61/923,608 entitled "A Dedicated Interface for Coupling Flash Memory and Dynamic Random Access Memory") and filed on 3 Jan. 2014, the entirety of which is incorporated by reference herein.

BACKGROUND

Field of the Disclosure

This application relates generally to processing systems, and, more particularly, to an interface for coupling flash memory and dynamic random access memory in processing systems.

Description of the Related Art

Processing systems use memory to store data or instructions for later use. For example, processing devices such as central processing units (CPUs), graphics processing units (GPUs), and accelerated processing units (APUs) can read instructions or data from memory, perform operations using the instructions or data, and then write the results back into the memory. Processing systems can implement different types of memory to store information. For example, non-volatile memory can be used for long-term storage of information because non-volatile memory retains information even when power is not supplied to the memory elements. In contrast, volatile memory requires a constant supply of power to retain information. Different types of memory are also distinguished on the basis of their memory storage density, which is equal to the memory capacity of the medium divided by the length, area, or volume of the memory element. Different types of memory may also have different bandwidths or speeds for read or write access and different latencies for memory accesses.

Dynamic random access memory (DRAM) is a form of volatile memory that requires periodic re-writing to retain information stored in the memory elements. For example, the memory elements in a conventional DRAM are formed of capacitors that need to be periodically refreshed in order to retain the information stored in the memory elements. The data transfer rate for read and write operations to DRAM is typically larger than non-volatile memories such as flash memory. Moreover, the data transfer rate for DRAM can be increased using double pumping wherein data is transferred on both the rising and falling edges of the DRAM clock signal. This type of DRAM may be referred to as double data rate (DDR) DRAM because the data transfer rate is approximately double the rate that can be achieved by transferring data only on the rising or falling edge of the DRAM clock signal.

Flash memory is a form of non-volatile memory that stores information in a floating gate of a transistor. Once the floating gate has been charged, electrons remain trapped in the floating gate and do not discharge for many years. Flash memory comes in two varieties: NOR flash memory and NAND flash memory. A NOR flash memory cell has one end of its transistor connected directly to ground and the other and connected directly to a bit line. The word line of a NOR flash memory cell is connected to the control gate. The sources and drains of floating gate transistors in NAND memory cells are connected in series with the bit lines of the NAND flash memory and word lines are connected to the control gates of the floating gate transistors.

BRIEF DESCRIPTION OF THE DRAWINGS

The present disclosure may be better understood, and its numerous features and advantages made apparent to those skilled in the art, by referencing the accompanying drawings. The use of the same reference symbols in different drawings indicates similar or identical items.

DETAILED DESCRIPTION

Figure 1:
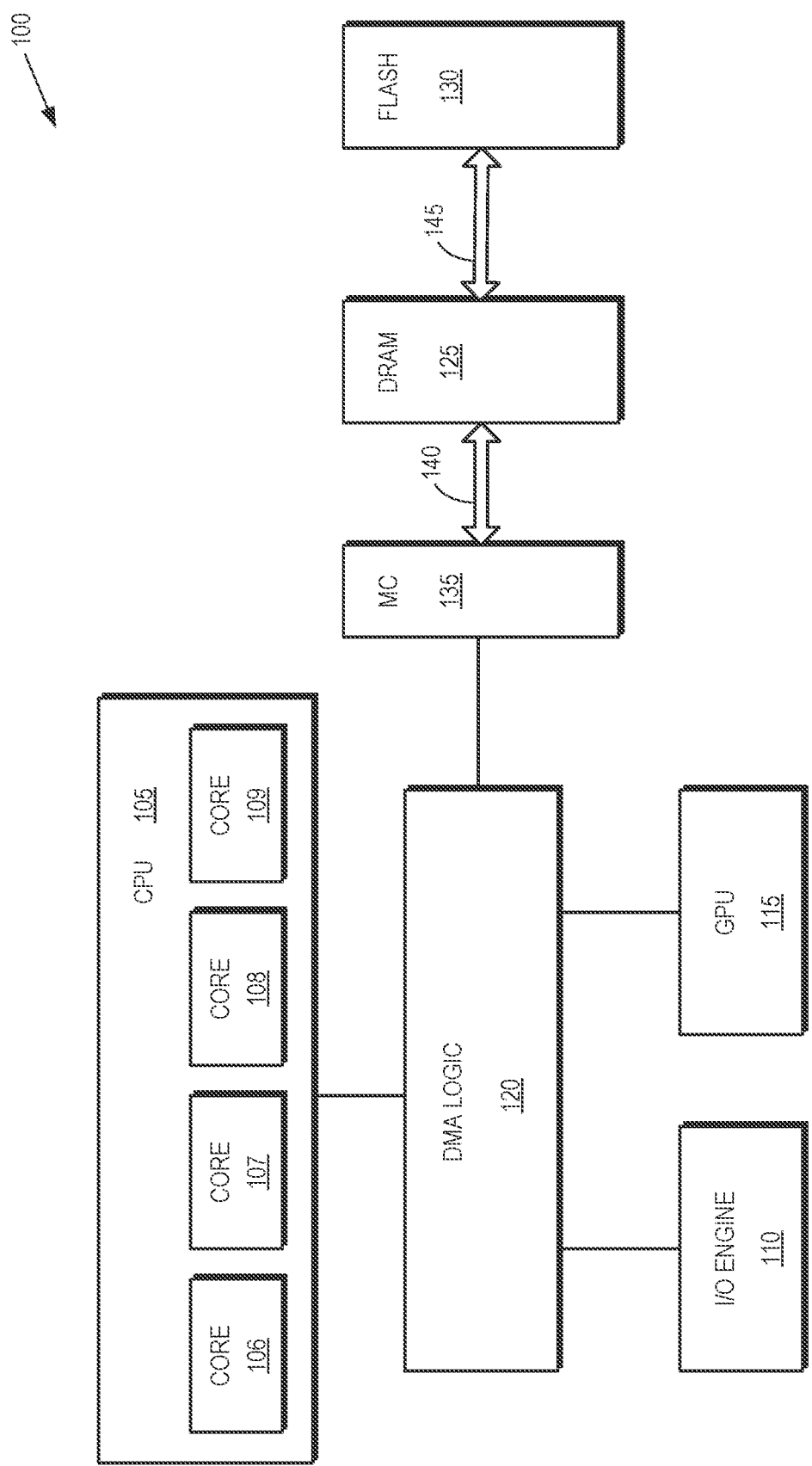
FIG. 1 is a block diagram of a processing system in accordance with some embodiments.

As discussed herein, dynamic random access memory (DRAM) provides volatile storage for information. Processing devices can access the stored information relatively quickly (e.g., at high data transfer rates and low latency) through a DRAM interface between the processing device and the DRAM. For example, data can be written to and retrieved from a DRAM array with a latency that is typically less than 20 ns. Double data rate (DDR) DRAM uses techniques such as double pumping to increase the data transfer rate through the DRAM interface by reading or writing information on the rising and falling edges of the clock signal. Flash memory provides non-volatile storage and typically has a larger storage density and capacity than a correspondingly priced DDR DRAM. However, access latency to flash arrays are substantially longer, typically 25 µs for reads and several milliseconds for writes. Furthermore, the data transfer rates over flash memory interfaces are typically significantly lower than the data transfer rates over DDR DRAM interfaces.

FIGS. 1-7 describe some embodiments of a dedicated memory interface between a DRAM and one or more flash memories. As used herein, the term "dedicated" indicates that the interface is only available for communication between the DRAM and the one or more flash memories. For example, the dedicated memory interface may be formed using direct connections between contacts in the DRAM and the one or more flash memory. When connected by the dedicated memory interface, the combined DRAM and flash memories have the storage density/capacity of the flash memory and they can be accessed at the data transfer rates and latency of the DRAM. Some embodiments of the DRAM include a dedicated backside interface that can be controlled using instructions received by the DRAM over the DRAM interface. The dedicated backside interface is used to write information to the flash memory and read information from the flash memory over connections between the DRAM and the flash memory. A host memory controller can initiate transfers over the dedicated backside interface between the DRAM and the flash memory using instructions transmitted via the DRAM interface. For example, the host memory controller can issue requests to prefetch data from the flash memory into the DRAM or perform page-in/out operations between the flash memory and the DRAM. Consequently, information that is stored in the flash memory can be moved into the DRAM before it is needed, e.g., by instructions executing in a processing device that accesses the DRAM through the DRAM interface.

Connecting the DRAM and the flash memory with a dedicated interface that can be controlled via the DRAM interface provides a larger memory footprint (due to the higher density and capacity of the flash memory) while also supporting access speeds that approach the access speed of the DRAM interface. Some embodiments of the dedicated interface are implemented using through silicon vias (TSVs) that couple the DRAM to the flash memory in a 3-dimensional or 2.5-dimensional configuration. The bandwidth of the dedicated interface may therefore be significantly larger than the bandwidth of a standard flash interface, e.g., 2112 bytes per cycle for full flash page transfers. Read or write requests to the flash memory may also be pipelined to improve the average throughput of the dedicated interface.

FIG. 1 is a block diagram of a processing system 100 in accordance with some embodiments. The processing system 100 includes a central processing unit (CPU) 105 for executing instructions. Some embodiments of the CPU 105 include multiple processor cores 106-109 that can execute instructions independently, concurrently, and/or in parallel. The CPU 105 shown in FIG. 1 includes four processor cores 106-109. However, persons of ordinary skill in the art having benefit of the present disclosure should appreciate that the number of processor cores in the CPU 105 is a matter of design choice. Some embodiments of the CPU 105 may include more or fewer than the four processor cores 106-109 shown in FIG. 1. The processing system 100 also includes an input/output engine 110 for handling input or output operations associated with elements of the processing system such as keyboards, mice, printers, external disks, and the like. A graphics processing unit (GPU) 115 is also included in the processing system 100 for creating visual images intended for output to a display. Some embodiments of the GPU 115 may include multiple processor cores (not shown).

The processing system 100 shown in FIG. 1 also includes direct memory access (DMA) logic 120 for generating addresses and initiating memory read or write cycles. The CPU 105 may initiate transfers between memory elements in the processing system 100 (such as the DRAM memory 125 and flash memory 130 discussed below) and/or entities connected to the DMA logic 120 including the CPU 105, the I/O engine 110, and the GPU 115. Some embodiments of the DMA logic 120 may also be used for memory-to-memory data transfer or transferring data between the cores 106-109. The CPU 105 can perform other operations concurrently with the data transfers being performed by the DMA logic 120 which may provide an interrupt to the CPU 105 to indicate that the transfer is complete.

A memory controller (MC) 135 may be used to coordinate the flow of data between the DMA logic 120, the DRAM 125, and the flash memory 130. The memory controller 135 includes logic used to control reading information from the DRAM 125 and writing information to the DRAM 125. The memory controller 135 may also include refresh logic that is used to periodically re-write information to the DRAM 125 so that information in the memory cells of the DRAM 125 is retained. Some embodiments of the DRAM 125 may be double data rate (DDR) DRAM, in which case the memory controller 135 may be capable of transferring data to and from the DRAM 125 on both the rising and falling edges of a memory clock. The memory controller 135 may control data transfers by issuing instructions to the DRAM 125 over a DRAM interface 140. For example, the memory controller 135 may issue mode register set (MRS) instructions to set values of mode registers (not shown) in the DRAM 125 that indicate different functions to be performed by the DRAM 125 such as refreshing, reading, or writing the DRAM 125.

A dedicated interface 145 couples the DRAM 125 and the flash memory 130. Portions of the dedicated interface 145 may be implemented in the DRAM 125, the flash memory 130, or a separate control element (not shown). For example, the DRAM 125 may include control logic for the dedicated interface 145 that generates parity checks, cyclic code redundancy sums, or error correcting codes. The control logic may also perform error correction for information transmitted over the dedicated interface 145. Some embodiments of the control logic may also be configured to map logical addresses in instructions received over the DRAM interface 140 to physical addresses in the flash memory 130. Some embodiments of the dedicated interface 145 may be implemented using through silicon vias (TSVs) to couple the DRAM 125 to the flash memory 130 so that the DRAM 125 and the flash memory 130 can be stacked, e.g., in a 3-dimensional or 2.5-dimensional configuration as discussed below.

The memory controller 135 may control access to the flash memory 130 using instructions transmitted over the DRAM interface 140. For example, the memory controller 135 may issue MRS instructions that control the dedicated interface 145. The MRS instructions may include information identifying a DRAM row address in the DRAM 125, a bank address in the DRAM 125, a logical address in the flash memory 130, or a field identifying the instruction as a read or a write instruction.

The instructions transmitted by the memory controller 135 over the DRAM interface 140 can be used to implement different types of read or write access to the flash memory 130. For example, the memory controller 135 may issue an instruction to prefetch information from the flash memory 130 into the DRAM 125 if the memory controller 135 determines that this information may subsequently be requested from the DRAM 125. Techniques for determining when to prefetch information are known in the art and in the interest of clarity are not discussed in detail herein. For another example, the memory controller 135 may issue a page-in instruction to read at least one page from the flash memory 130 into the DRAM 125 over the dedicated interface 145 or the memory controller 135 may issue a page-out instruction to write at least one page from the DRAM 125 into the flash memory 130 over the dedicated interface 145. The dedicated interface 145 may then perform the access indicated by the instruction. Some embodiments of the dedicated interface 145 may perform the access concurrently with other communications occurring over the DRAM interface 140.

Figure 2:
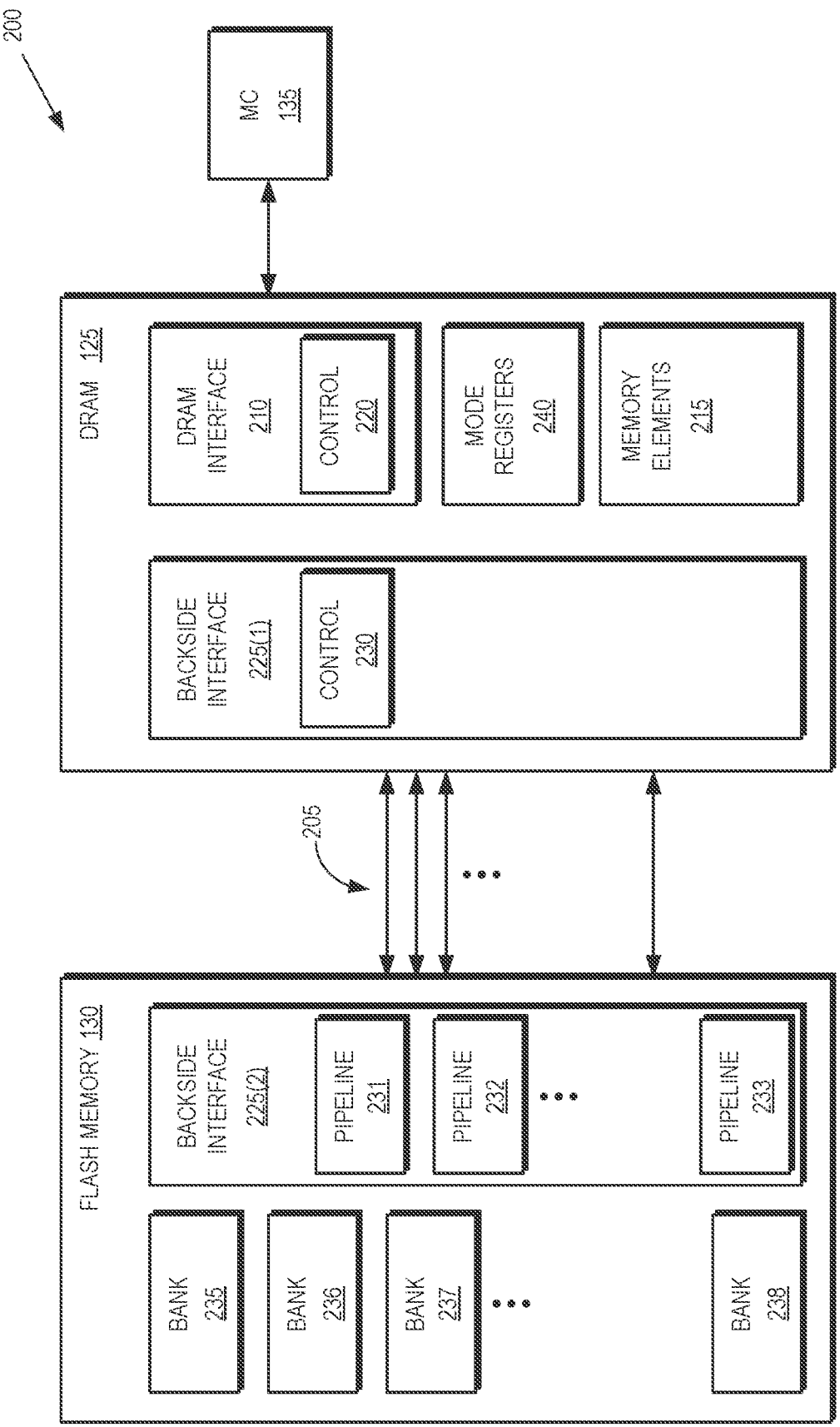
FIG. 2 is a block diagram of a portion of a processing system such as the processing system shown in FIG. 1 in accordance with some embodiments.

FIG. 2 is a block diagram of a portion 200 of a processing system such as the processing system 100 shown in FIG. 1 in accordance with some embodiments. The portion 200 of the processing system includes a flash memory, a DRAM, and a memory controller such as the flash memory 130, the DRAM 125, and the memory controller 135 shown in FIG. 1. The DRAM 125 and the flash memory 130 are coupled by a plurality of connections 205 that form part of a dedicated interface between the DRAM 125 and the flash memory 130. Exemplary connections 205 include TSVs, wires, traces, lines, optical fibers, or other media for conveying information between the DRAM 125 and the flash 130. The DRAM 125 may receive instructions or data from the memory controller 135 over the DRAM interface 210. For example, the DRAM 125 may receive requests to read or write from memory elements 215. The DRAM interface 210 may therefore include control logic 220 for interpreting the instructions and causing the requested information to be read from or written to the memory elements 215.

The DRAM interface 210 may also receive instructions from the memory controller 135 that are used to access the flash memory 130. Control logic 220 may cause these instructions to be forwarded from the DRAM interface 210 to a backside interface 225 that is dedicated to supporting communication between the DRAM 125 and the flash memory 130. Some embodiments may implement portions of the backside interface 225 in the DRAM 125 and the flash memory 130. For example, the portion 225(1) may be implemented in the DRAM 125 and may include control logic 230 for controlling operation of the backside interface 225. Some embodiments of the control logic 230 may implement error correction algorithms. Some embodiments of the control logic 230 may also be used to translate logical addresses in the instructions received from the DRAM interface 210 to physical addresses in the flash memory 130. The control logic 230 may also perform bad block management and/or wear leveling operations to reduce wear on the flash memory 130 or distribute the write operations uniformly throughout the addresses in the flash memory 130. For example, the control logic 230 may implement a least-recently-written policy to choose the physical addresses in the flash memory 130 so that the number of write operations to the flash memory 130 is minimized. Embodiments of the control logic 230 may also give preference to reading information from the flash memory 130 over writing information to the flash memory 130, as well as bypassing eviction of information from the DRAM 125 if this information is already stored in the flash memory 130.

The portion 225(2) may be implemented in the flash memory 130 and may include multiple pipeline stages 231-233 for performing pipelined execution of instructions. Exemplary functions performed by the multiple pipeline stages 231-233 may include fetching instructions, decoding instructions, executing instructions, performing memory access, and writing back registers. Some embodiments of the flash memory 130 include multiple banks 235-238 of memory locations that can be accessed independently and concurrently. Thus, different instructions in the pipeline stages 231-233 can be concurrently processing instructions associated with addresses in the different memory banks 235-238. Pipelining the instructions through the backside interface 225 therefore allows multiple instructions to be processed concurrently so that the backside interface 225 is substantially continuously utilized despite the difference in latencies between the flash memory 130 and the DRAM 125.

Some embodiments of the control logic 230 may coordinate operation of the pipeline stages 231-233 to avoid memory bank conflicts between instructions that are issued for processing in the pipeline stages 231-233.

Some embodiments of the DRAM 125 include one or more mode registers 240 that can be used to configure operation of the components of the DRAM 125. For example, MRS instructions may be issued by the memory controller 135 and used to store information in one or more of the mode registers 240. This information can then be used to configure operation of the DRAM 125. Some embodiments of the mode registers 240 may include additional mode register locations that are used to control reading or writing information to or from the flash memory 130 over the backside interface 225. The memory controller 135 may therefore issue MRS instructions that write information to the additional mode register locations to trigger reading or writing information to or from the flash memory 130.

The backside interface 225 may also support other functionality. Some embodiments of the backside interface 225 may support reading or writing page sizes of 4 kB. The backside interface 225 may also support write-erase of block sized portions of the memory, which may improve wear management and performance. Some embodiments of the backside interface 225 may support instructions such as a secure erase instruction that erases contents of portions of the flash memory 130 and clears the logical/physical mapping of the logical addresses of instructions received over the DRAM interface 210 to the physical addresses of memory locations in the flash memory 130. The control circuit 230 may keep track of wear and bad blocks during execution of the secure erase instruction. The backside interface 225 may also support a safety instruction that that writes/reads the entire contents of the DRAM 125 to/from the flash memory 130. For example the safety instruction can be deployed, with sufficient backup power, for power failure scenarios. The dedicated interface 145 may also support an instruction for buffering writes to the flash memory 130. This instruction could be used to buffer information in the flash memory 130 to an SRAM (not shown) that is available to buffer up write instructions to hide latencies that may be disproportionately large relative to the latencies of read instructions, particularly if the write instructions force garbage collection during management of the flash memory 130.

Figure 3:
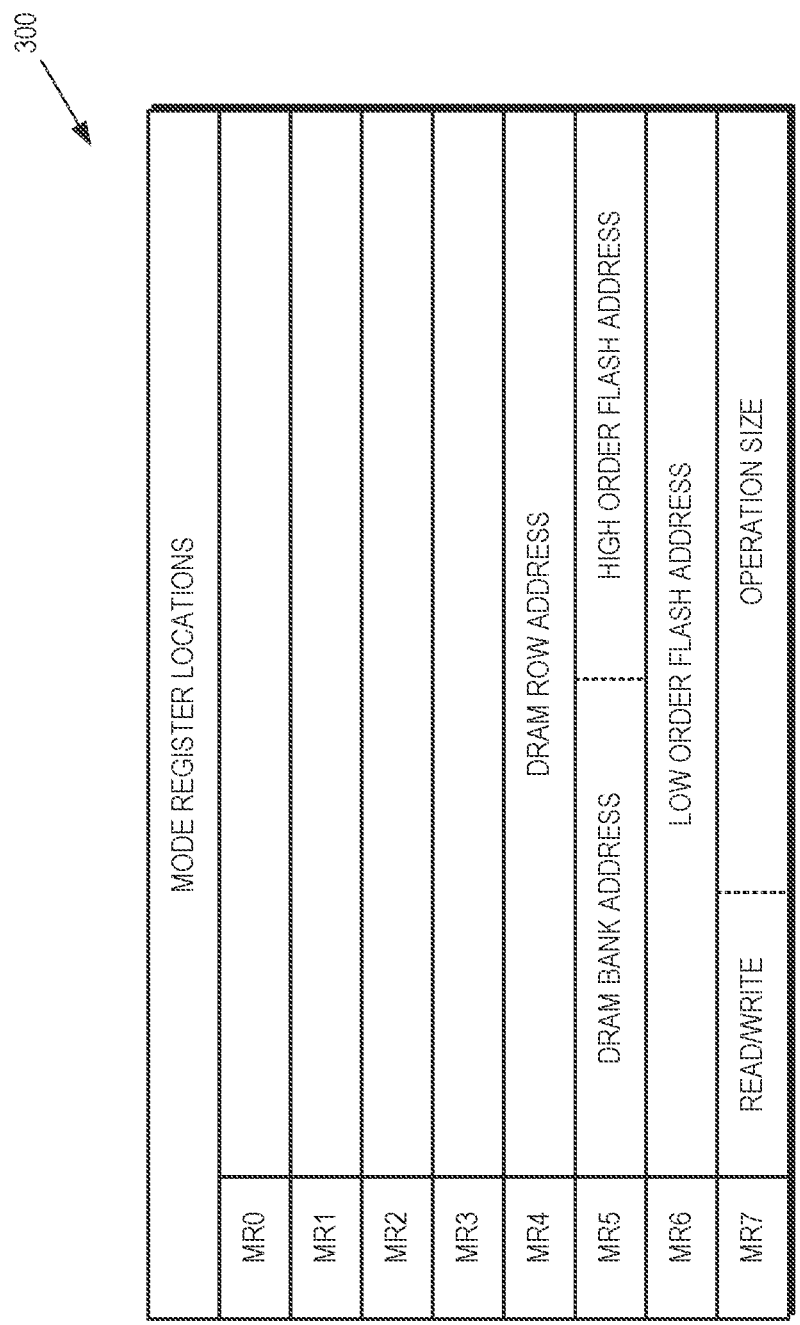
FIG. 3 is a block diagram of a mode register that may be implemented in the mode registers shown in FIG. 2 in accordance with some embodiments.

FIG. 3 is a block diagram of a mode register 300 that may be implemented in the mode registers 240 shown in FIG. 2 in accordance with some embodiments. The mode register 300 shown in FIG. 3 includes a plurality of mode register locations (MR0-MR7) that can store a plurality of bytes of information. The first four mode register locations (MR0-MR3) are used to store information for configuring or operating the DRAM 125. The next four mode register locations (MR4-MR7) are used to store information used for accessing information stored in a flash memory such as the flash memory 130 shown in FIG. 1 over an interface such as the dedicated interface 145 shown in FIG. 1. For example, the mode register location MR4 may include a 4 kB aligned DRAM row address, the mode register location MR5 may include a DRAM bank address and a high order portion of a 4 kB aligned logical address in the flash memory, the mode register location MR6 may include a lower order portion of the 4 kB aligned logical address in the flash memory, and the mode register location MR7 may include information indicating whether the instruction is a read or a write instruction and a size of the instruction, e.g., a range from a minimum of 4 kB to a maximum value. Writing information to the mode register location MR7, e.g., in response to an MRS instruction received over the DRAM interface 210 from the memory controller 135, may be used as the trigger for initiating execution of the associated instruction in some embodiments.

Figure 4:
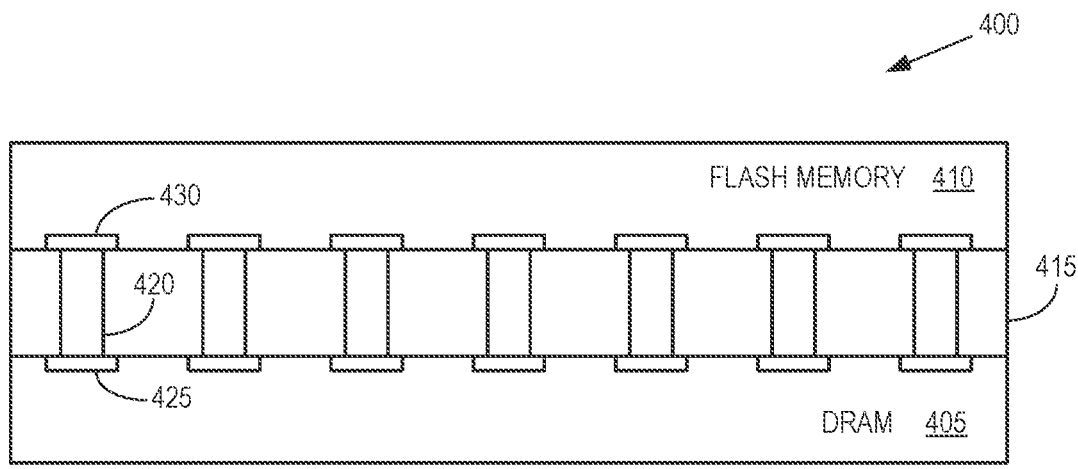
FIG. 4 is a diagram of a memory structure that includes a DRAM and a flash memory in accordance with some embodiments.

FIG. 4 is a diagram of a memory structure 400 that includes a DRAM 405 and a flash memory 410 in accordance with some embodiments. Some embodiments of the DRAM 405 and the flash memory 410 may be used to implement the DRAM 125 and the flash memory 130 shown in FIG. 1. An interposer 415 is deployed over the DRAM 405 and the flash memory 410 is deployed over the interposer 415. Some embodiments of the interposer 415 may form a portion of a dedicated interface between the DRAM 405 and the flash memory 410. A memory structure 400 that has the DRAM 405, the interposer 415, and the flash memory 410 stacked above each other may be referred to as a 3-dimensional configuration of the memory structure 400. Some embodiments of the interposer 415 are formed of silicon and include a plurality of TSVs 420 (only one indicated by a reference numeral in the interest of clarity) to connect contacts 425 (only one indicated by a reference numeral in the interest of clarity) in the DRAM 405 to contacts 430 (only one indicated by a reference numeral in the interest of clarity) in the flash memory 410. The TSVs 420 may be used to implement a dedicated interface between the DRAM 405 and the flash memory 410 such as the dedicated interface 145 shown in FIG. 1 or the dedicated backside interface 225 shown in FIG. 2. For example, the TSVs 420 may be used to implement the connections 205 shown in FIG. 2.

Figure 5:
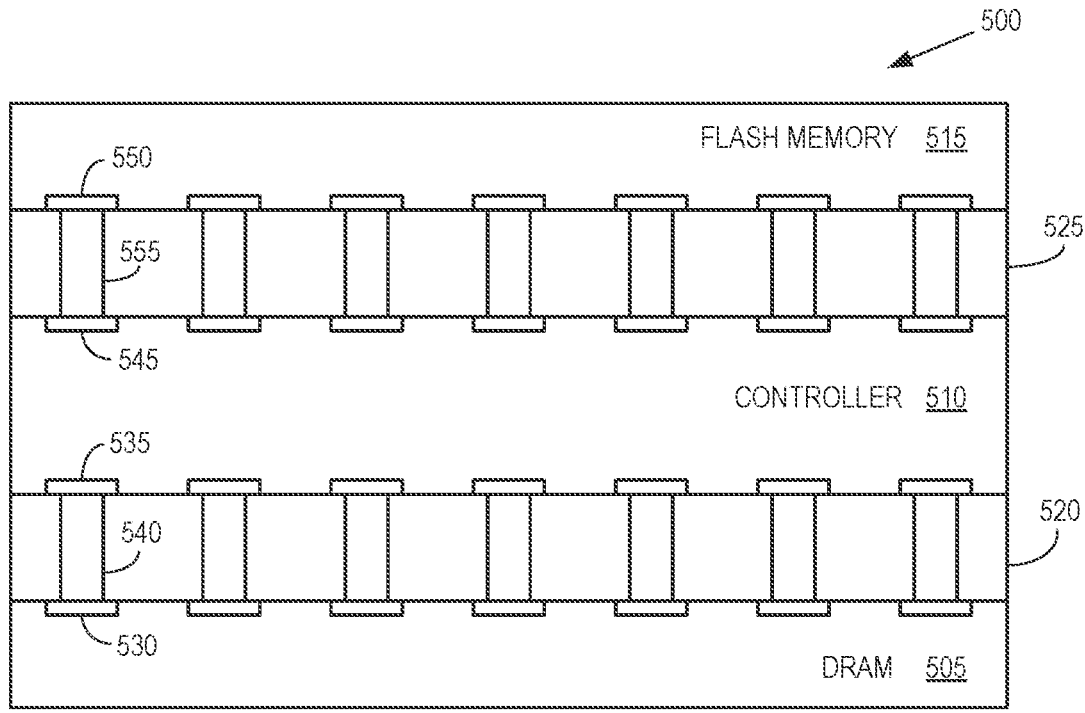
FIG. 5 is a diagram of a memory structure that includes a DRAM, a controller, and a flash memory in accordance with some embodiments.

FIG. 5 is a diagram of a memory structure 500 that includes a DRAM 505, a controller 510, and a flash memory 515 in accordance with some embodiments. Some embodiments of the DRAM 505, the controller 510, and the flash memory 515 may be used to implement the DRAM 125, the control circuit 230, and the flash memory 130 shown in FIG. 2. An interposer 520 is deployed over the DRAM 505 and the controller 510 is deployed over the interposer 520. Contacts 530 in the DRAM 505 are connected to contacts 535 in the controller 510 using TSVs 540. An interposer 525 is deployed over the controller 510 and the flash memory 515 is deployed over the interposer 525. Contacts 545 in the controller 510 are connected to contacts 550 in the flash memory 515 using TSVs 555. The memory structure 500 may be referred to as a 3-dimensional configuration because the DRAM 505, the controller 510, and the flash memory 515 are stacked above each other. Some embodiments of the interposers 520, 525 and the TSVs 540, 555 may be used to implement a dedicated interface between the DRAM 505 and the flash memory 515 such as the dedicated interface 145 shown in FIG. 1 or the backside interface 225 shown in FIG. 2. For example, a portion of the TSVs 540, 555 may be used to implement a portion of the connections 205 shown in FIG. 2.

Figure 6:
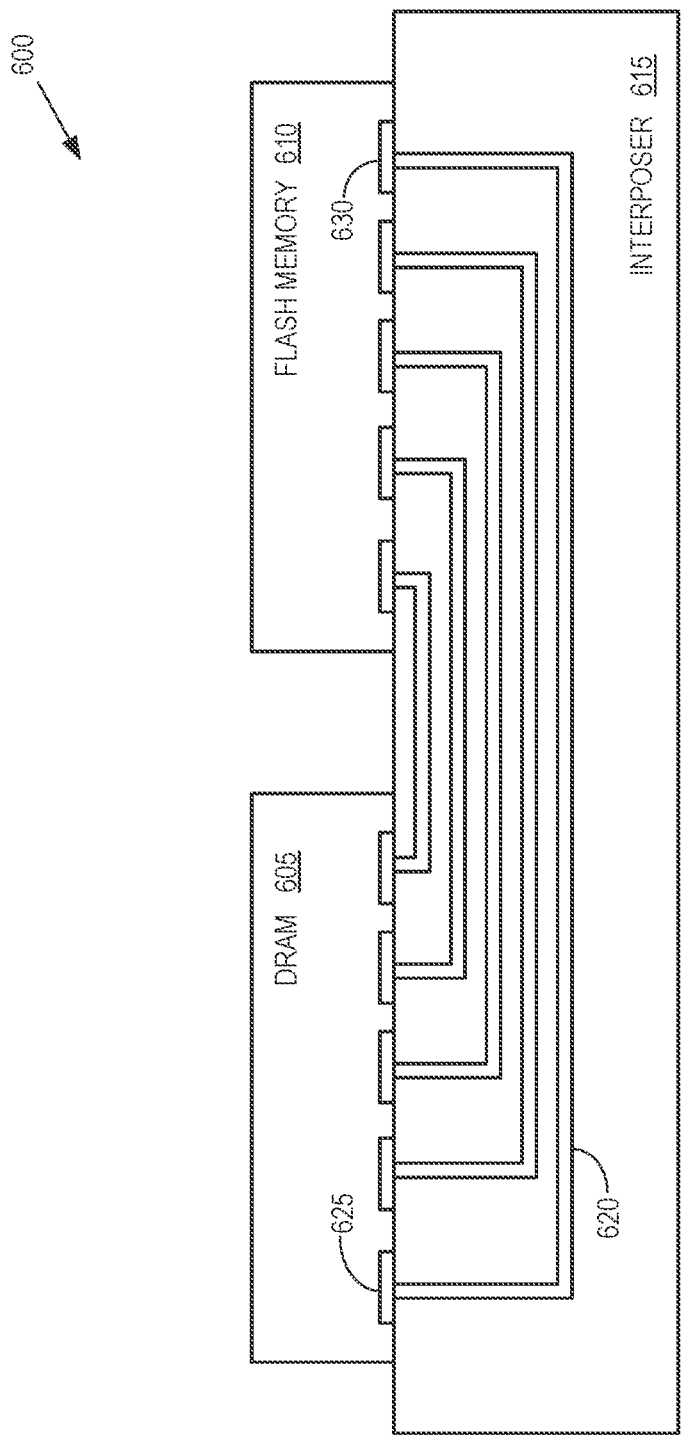
FIG. 6 is a diagram of a memory structure that includes a DRAM and a flash memory that are deployed above an interposer in accordance with some embodiments.

FIG. 6 is a diagram of a memory structure 600 that includes a DRAM 605 and a flash memory 610 that are deployed above an interposer 615 in accordance with some embodiments. Some embodiments of the DRAM 605 and the flash memory 610 may be used to implement the DRAM 125 and the flash memory 130 shown in FIG. 1. A memory structure 600 that has the DRAM 605 and the flash memory 610 deployed adjacent to each other and above the interposer 615 may be referred to as a 2.5-dimensional configuration of the memory structure 600. Some embodiments of the interposer 615 are formed of silicon and include a plurality of conductive paths 620 to connect contacts 625 in the DRAM 605 to contacts 630 in the flash memory 610. In some embodiments, vertical portions of the conductive paths 620 may be referred to as vias and horizontal portions of the conductive paths 620 may be referred to as lines. Some embodiments of the interposer 615 and the conductive paths 620 may be used to implement a backside interface between the DRAM 605 and the flash memory 610 such as the dedicated interface 145 shown in FIG. 1 or the backside interface 225 shown in FIG. 2. For example, the conductive paths 620 may be used to implement the connections 205 shown in FIG. 2. Some embodiments of the 2.5-dimensional memory structure 600 may also include a controller (not shown) deployed on the interposer 615 and interconnected with the DRAM 605 and the flash memory 610 by one or more conductive paths (not shown).

Figure 7:
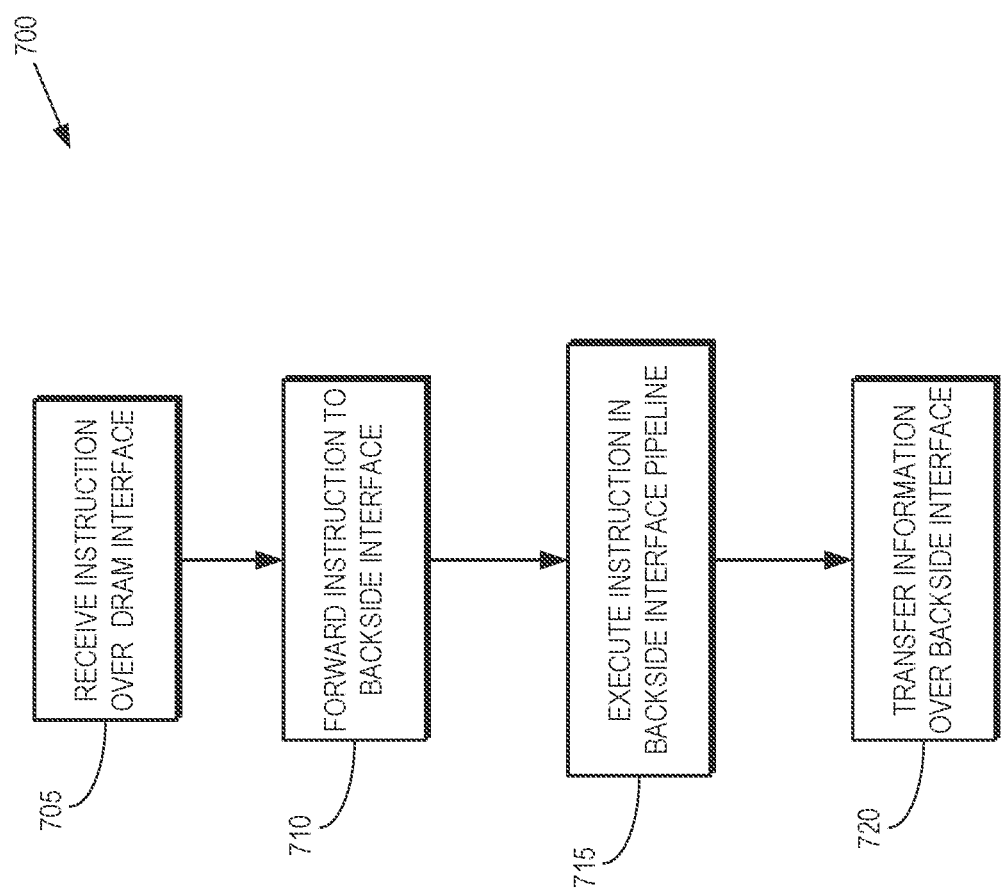
FIG. 7 is a flow diagram of a method for accessing flash memory using a backside interface between the flash memory and a DRAM in accordance with some embodiments.

FIG. 7 is a flow diagram of a method 700 for accessing flash memory using a backside interface between the flash memory and a DRAM in accordance with some embodiments. The method 700 is described with respect to an example implementation of the DRAM 125, the flash memory 130, and the dedicated interface 145 of FIG. 1. At block 705, the DRAM 125 receives an instruction over a DRAM interface such as the DRAM interface 140 shown in FIG. 1. The DRAM 125 may then determine that the instruction is requesting access to the flash memory 130 over the dedicated interface 145. The DRAM 125 may forward the instruction to the dedicated interface 145 at block 710. For example, the instruction may be forwarded to the dedicated interface 145 in response to the DRAM 125 receiving an MRS instruction that writes to a mode register location that is reserved for requests to access the flash memory 130 over the dedicated interface 145.

At block 715, the instruction may be executed by the flash memory 130. For example, the dedicated interface 145 may include one or more pipeline stages such as the pipeline stages 231-233 shown in FIG. 2 so that the dedicated interface 145 may be able to concurrently execute multiple instructions in a pipelined manner. At block 720, information may be transferred over the dedicated interface 145 in response to execution of the instruction. For example, execution of a read instruction may cause information stored in the flash memory 130 to be transferred over the dedicated interface 145 to the DRAM 125, where it may be stored. For another example, execution of a write instruction may cause information stored in the DRAM 125 to be transferred over the dedicated interface 145 to the flash memory 130, where it may be stored.

Some embodiments of the flash memory 130 may also be able to provide feedback to indicate the status of instructions being executed. For example, feedback may indicate the completion status of instructions such as information indicating that the instruction is in progress, information indicating that the instruction failed, and the like. Some embodiments of the flash memory 130 may therefore be able to transmit completion status signals over the dedicated interface 145. For example, the flash memory 130 may be able to transmit explicit busy signals and/or error status signals to the dedicated interface 145. In some cases, the signals can be transmitted open-drain to allow easy combination of state into a single signal or set of signals for transmission. For another example, the flash memory may be able to transmit instruction/address parity error signals that assert with defined latency after an instruction is received. In some embodiments, this mechanism could be overloaded to carry completion status information. For example, a read to a DRAM page that is busy waiting for data to be restored from the flash memory 130 could generate a "parity error." The instruction may then be retried after some delay and may timeout if the instruction is still unsuccessful after a predetermined maximum time or maximum count.

In some embodiments, the apparatus and techniques described above are implemented in a system comprising one or more integrated circuit (IC) devices (also referred to as integrated circuit packages or microchips), such as the backside interface described above with reference to FIGS. 1-7. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 8:
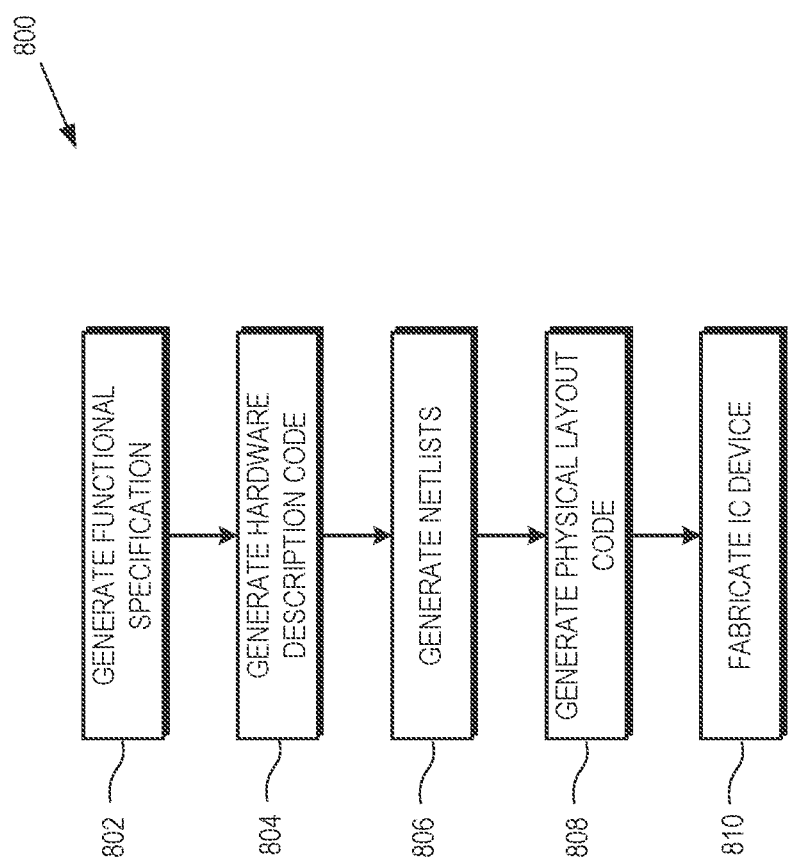
FIG. 8 is a flow diagram illustrating an example method for the design and fabrication of an IC device implementing one or more aspects, according to some embodiments.

FIG. 8 is a flow diagram illustrating an example method 800 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 802 a functional specification for the IC device is generated. The functional specification (often referred to as a micro architecture specification (MAS)) may be represented by any of a variety of programming languages or modeling languages, including C, C++, SystemC, Simulink, or MATLAB.

At block 804, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 806 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 808, one or more EDA tools use the netlists produced at block 806 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 810, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A memory system, comprising:
a dynamic random access memory (DRAM);
a flash memory; and
a dedicated interface between the DRAM and the flash memory, wherein a first portion of the dedicated interface is implemented in the DRAM and a second portion of the dedicated interface is implemented in the flash memory, and further wherein the dedicated interface is only available for communication between the flash memory and the DRAM.

2. The memory system of claim 1, wherein the first portion of the dedicated interface includes control logic to control operation of the dedicated interface.

3. The memory system of claim 1, wherein the second portion of the dedicated interface includes multiple pipeline stages to perform pipelined execution of instructions in the flash memory.

4. The memory system of claim 3, wherein the multiple pipeline stages are configured so that a plurality of requests can be processed concurrently by the dedicated interface.

5. The memory system of claim 1, further comprising:
a DRAM interface between the DRAM and a processing device, wherein the dedicated interface is to provide prefetch data from the flash memory into the DRAM in response to a prefetch request provided over the DRAM interface prior to the DRAM receiving a request for the prefetched data.

6. The memory system of claim 5, wherein the dedicated interface is to convey at least one page from the flash memory into the DRAM over the dedicated interface in response to a page-in instruction received by the DRAM over the DRAM interface.

7. A method, comprising:
accessing a flash memory via a dedicated interface between the flash memory and a dynamic random access memory (DRAM), wherein a first portion of the dedicated interface is implemented in the DRAM and a second portion of the dedicated interface is implemented in the flash memory, and further wherein the dedicated interface is only available for communication between the flash memory and the DRAM.

8. The method of claim 7, further comprising:
concurrently performing a plurality of requests in a plurality of pipeline stages of the second portion of the dedicated interface.

9. The method of claim 7, further comprising:
controlling operations of the dedicated interface using control logic at the first portion of the dedicated interface.

10. The method of claim 7, wherein accessing the flash memory further comprises:
accessing the flash memory in response to an instruction received over a DRAM interface between the DRAM and a processing device.

11. The method of claim 10, wherein accessing the flash memory further comprises:
prefetching data from the flash memory into the DRAM via the dedicated interface in response to a prefetch request provided over the DRAM interface prior to the DRAM receiving a request for the prefetched data over the DRAM interface.

12. The method of claim 10, wherein accessing the flash memory further comprises:
conveying at least one page from the flash memory into the DRAM over the dedicated interface in response to a page-in instruction received by the DRAM over the DRAM interface.

13. The method of claim 10, wherein accessing the flash memory further comprises:
conveying at least one page from the DRAM into the flash memory over the dedicated interface in response to a page-out instruction received by the DRAM over the DRAM interface.

14. The method of claim 10, wherein accessing the flash memory further comprises:
accessing the flash memory over a plurality of through silicon vias (TSVs) that couple the flash memory to the DRAM.

15. A memory system, comprising:
a volatile memory;
a non-volatile memory; and
a dedicated interface between the volatile memory and the non-volatile memory, wherein a first portion of the dedicated interface is implemented in the volatile memory and a second portion of the dedicated interface is implemented in the non-volatile memory, and further wherein the dedicated interface is only available for communication between the volatile memory and the non-volatile memory.

16. The memory system of claim 15, wherein the first portion of the dedicated interface includes control logic to control operation of the dedicated interface.

17. The memory system of claim 15, wherein the second portion of the dedicated interface includes multiple pipeline stages to perform pipelined execution of instructions in the non-volatile memory.

18. The memory system of claim 17, wherein the multiple pipeline stages are configured so that a plurality of requests can be processed concurrently by the dedicated interface.

19. The memory system of claim 15, further comprising:
a volatile memory interface between the volatile memory and a processing device, wherein the dedicated interface is to provide prefetch data from the non-volatile memory into the volatile memory in response to a prefetch request provided over the volatile memory interface prior to the volatile memory receiving a request for the prefetched data.

20. The memory system of claim 19, wherein the dedicated interface is to convey at least one page from the non-volatile memory into the volatile memory over the dedicated interface in response to a page-in instruction received by the volatile over the volatile memory interface.

* * * * *

UNITED STATES PATENT AND TRADEMARK OFFICE
CERTIFICATE OF CORRECTION

| | |
|---|---|
| PATENT NO. | : 11,029,852 B2 |
| APPLICATION NO. | : 15/378473 |
| DATED | : June 8, 2021 |
| INVENTOR(S) | : James Bauman |

It is certified that error appears in the above-identified patent and that said Letters Patent is hereby corrected as shown below:

In the Claims

At Column 13 Line 26, Claim 20 after the first occurrence, please insert --memory-- after the word "volatile"

Signed and Sealed this
Twenty-first Day of February, 2023

Katherine Kelly Vidal
*Director of the United States Patent and Trademark Office*